(12) United States Patent
Konrad

(10) Patent No.: US 10,118,521 B2
(45) Date of Patent: Nov. 6, 2018

(54) THERMOELECTRIC DEVICE

(71) Applicant: Nissan North America, Inc., Franklin, TN (US)

(72) Inventor: James Konrad, Windsor (CA)

(73) Assignee: Nissan North America, Inc., Franklin, TN (US)

( * ) Notice: Subject to any disclaimer, the term of this patent is extended or adjusted under 35 U.S.C. 154(b) by 142 days.

(21) Appl. No.: 15/246,209

(22) Filed: Aug. 24, 2016

(65) Prior Publication Data

US 2018/0056835 A1   Mar. 1, 2018

(51) Int. Cl.
| | |
|---|---|
| *H01L 35/28* | (2006.01) |
| *H01L 35/02* | (2006.01) |
| *B60N 2/56* | (2006.01) |
| *H01L 35/32* | (2006.01) |
| *H01L 35/34* | (2006.01) |

(52) U.S. Cl.
CPC ......... *B60N 2/5678* (2013.01); *B60N 2/5621* (2013.01); *H01L 35/325* (2013.01); *H01L 35/34* (2013.01)

(58) Field of Classification Search
CPC ... B60N 2/5678; B60N 2/5621; H01L 35/325; H01L 35/34
See application file for complete search history.

(56) References Cited

U.S. PATENT DOCUMENTS

| | | | |
|---|---|---|---|
| 8,969,703 B2 | 3/2015 | Makansi et al. | |
| 2008/0121263 A1* | 5/2008 | Schutte | H01L 35/32 136/203 |
| 2013/0087180 A1* | 4/2013 | Stark | H01L 35/30 136/205 |
| 2018/0076375 A1* | 3/2018 | Makansi | H01L 35/32 |

* cited by examiner

*Primary Examiner* — Angelo Trivisonno (57) ABSTRACT

A thermoelectric device has a foam substrate, thermoelectric elements and metallic foil strip assemblies. The foam substrate has apertures therein. The thermoelectric elements are inserted into the apertures. The metallic foil strip assemblies include upper and lower foil strips. A first end of a first upper foil strip is inserted into a first aperture contacting an upper heat transferring surface of the first thermoelectric element. A second end is inserted into a second aperture contacting an upper heat transferring surface of a second thermoelectric element with an elongated portion of the metallic foil strip assembly extending between the first aperture and the second aperture along the upper surface. A first end of a second upper foil strip is inserted into the second aperture contacting the upper heat transferring surface of the second thermoelectric element and a second end is similarly inserted into a third aperture.

19 Claims, 9 Drawing Sheets

THERMOELECTRIC DEVICE

BACKGROUND

Field of the Invention

The present invention generally relates to a thermoelectric device. More specifically, the present invention relates to thermoelectric device or pad installed within a vehicle seat that is configured to either heat or cool the seat.

Background Information

Thermoelectric devices that take advantage of the Peltier effect are used in many applications to provide heating and/or cooling.

SUMMARY

One object of the present disclosure is to provide a vehicle seat with at least one thermoelectric device or thermoelectric pad that is configured to provide heating in one setting and cooling in another setting utilizing the Peltier effect.

In view of the state of the known technology, one aspect of the present disclosure is to provide a thermoelectric device with a foam substrate, a plurality of thermoelectric elements and a plurality of metallic foil strips. The foam substrate has an upper surface and a lower surface, and includes a plurality of apertures that extend from the upper surface to the lower surface. The plurality of apertures define at least one linear row of apertures having at least a first aperture, a second aperture and a third aperture spaced apart from one another by a predetermined distance. The plurality of thermoelectric elements include at least a first element, a second element and a third element, each being inserted into a corresponding one of the first, second and third apertures. The plurality of metallic foil strips include at least a first upper foil strip and a second upper foil strip. Each of the plurality of metallic foil strips have a first end, a second end and an elongated portion extending therebetween. The first end of the first upper foil strip is inserted into the first aperture contacting an upper heat transferring surface of the first element and the second end that is inserted into the second aperture contacting an upper heat transferring surface of the second element with the elongated portion of the first upper foil strip extending between the first aperture and the second aperture along a corresponding portion of the upper surface of the foam substrate. The first end of the second upper foil strip is inserted into the second aperture contacting the upper heat transferring surface of the second element and the second end is inserted into the third aperture contacting an upper heat transferring surface of the third element with the elongated portion of the second upper foil strip extending between the second aperture and the third aperture along a second corresponding portion of the upper surface of the foam substrate.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
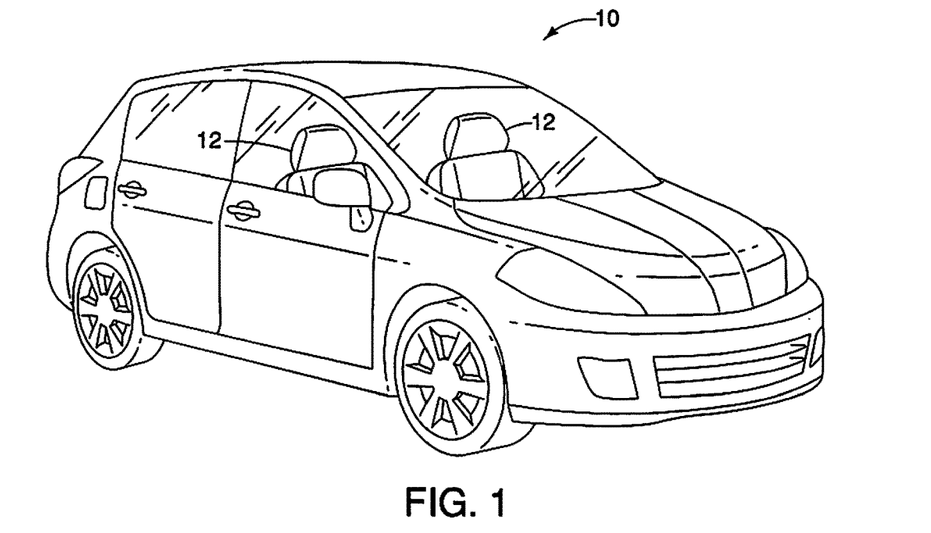
FIG. 1 is a perspective view of a vehicle that includes at least one vehicle seat having a thermoelectric device configured to heat or cool the seat in accordance with one embodiment.

Referring initially to FIG. 1, a vehicle 10 including at least one seat assembly 12 having at least one thermoelectric device 14 (FIG. 2) is illustrated in accordance with a first embodiment. The vehicle 10 is a conventional vehicle and can be a four door sedan, as depicted in FIG. 1, or can alternatively be a coupe, a sports utility vehicle (SUV), pick-up truck, luxury sedan or a commercial vehicle. In other words, the seats 12 and thermoelectric devices 14 described in greater detail can be installed in any of a variety of vehicle designs and configurations and is not limited to the four door sedan depicted in FIG. 1.

A description of the seat assembly 12 is now provided with specific reference to FIGS. 2-5. The vehicle 10 can be proved with several seat assemblies 12. Since the seat assembles 12 are generally the same or similarly equipped, a description of only one seat assembly 12 is provided for the sake of brevity, and applies equally to all of the seat assemblies 12 within the vehicle 10.

Figure 2:
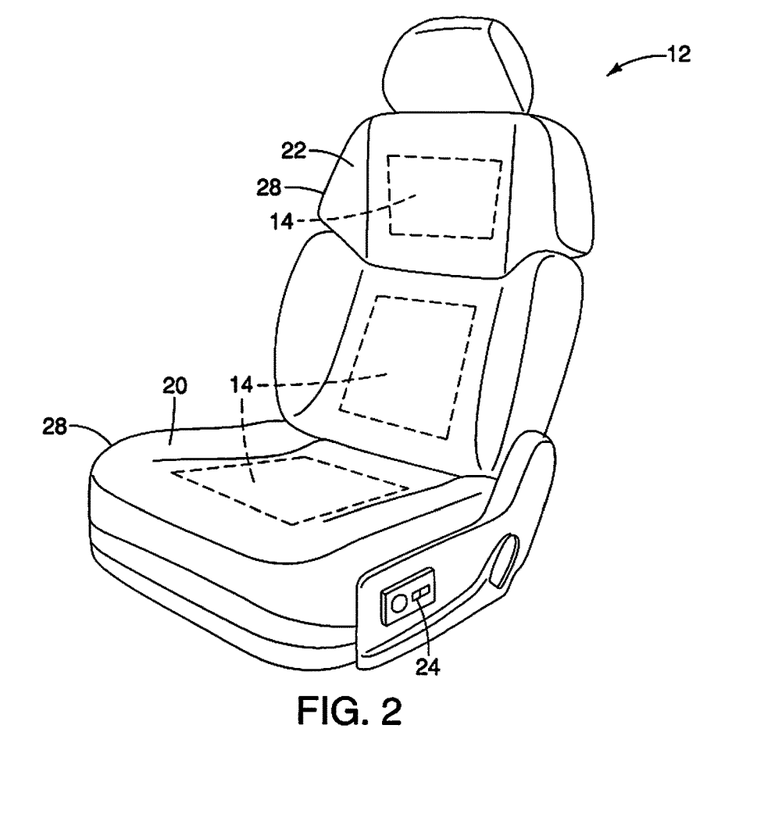
FIG. 2 is a perspective view of one of the vehicle seats removed from the vehicle showing a plurality of thermoelectric device installed within the vehicle seat in accordance with the one embodiment.

As shown in FIG. 2 removed from the vehicle 10, the seat assembly 12 includes a lower cushion portion 20, an upright cushion portion 22, three of the thermoelectric devices 14 and a control panel 24. In the depicted embodiment, the seat assembly 12 is depicted with multiple thermoelectric devices 14. However, it should be understood from the drawings and the description herein that the seat assembly 12 can include only one thermoelectric device 14, or alternatively can include two or three of the thermoelectric devices 14 as shown in FIG. 2. More specifically, the invention is not limited to a seat assembly 12 including three thermoelectric devices 14. Alternative numbers of thermoelectric devices 14 installed to the seat assembly 12 are clearly within the scope of the invention.

Figure 3:
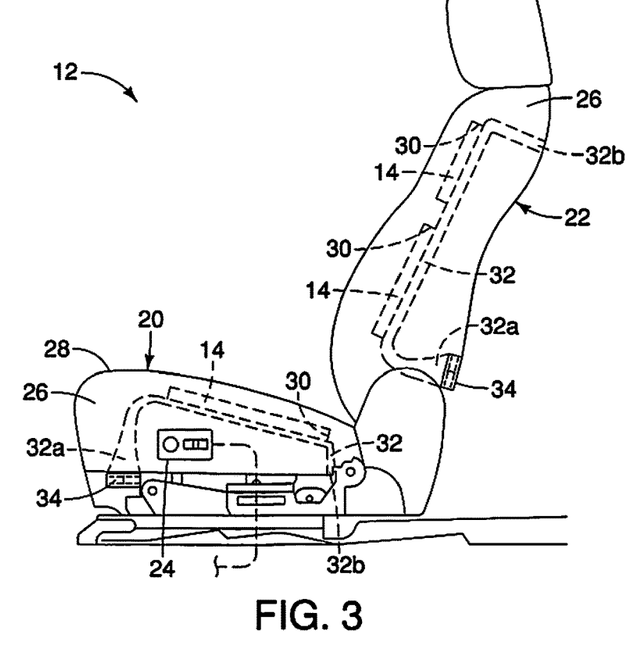
FIG. 3 is a side view of the vehicle seat showing details of the seat structure including cushion portions with air flow channels, recessed areas and the thermoelectric devices installed in respective ones of the recessed areas such that the air flow channels are open to respective ones of the thermoelectric devices for heat transfer in accordance with the one embodiment.
Figure 4:
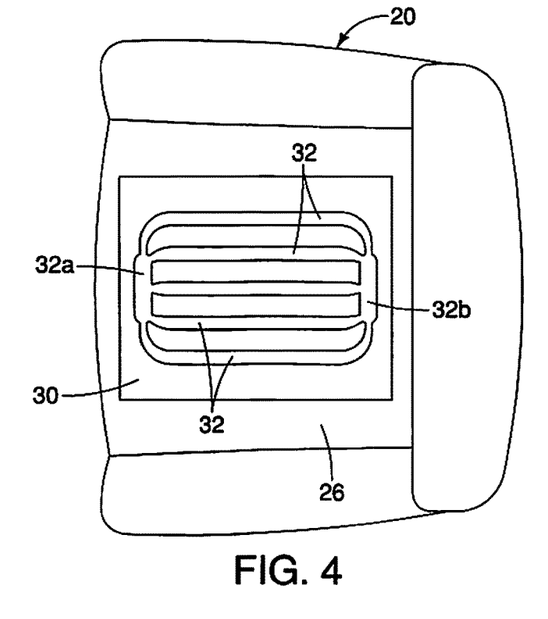
FIG. 4 is a top view of one of the cushion portions of the vehicle seat with a cover removed showing one of the recessed areas and the air flow channels open to the recessed area in accordance with the one embodiment.
Figure 5:
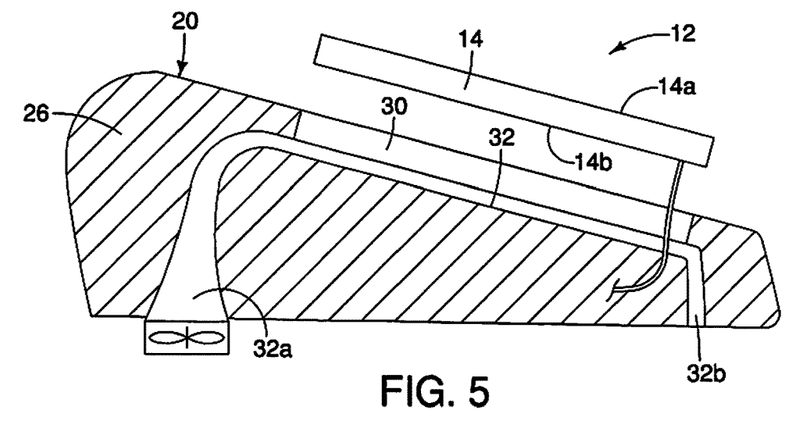
FIG. 5 is a cross-sectional view of the cushion portion of the vehicle seat depicted in FIG. 4, showing the recessed area and the air flow channels open to the recessed area in accordance with the one embodiment.

As shown in FIGS. 3 and 4, each of the lower cushion portion 20 and the upper cushion portion 22 includes a conventional metallic frame (not shown), cushion material 26 and a cover portion 28. The metallic frame of the seat assembly 12 is a conventional structure and is therefore well known. Consequently, description of the metallic frame is omitted for the sake of brevity. The cushion material 26 of each of the lower cushion portion 20 and the upper cushion portion 22 can include recessed area 30 (a heating element recess) dimensioned to receive the thermoelectric device 14. The cushion material 26 also includes air flow channels 32 including an air inlet 32a and an outlet 32b. A fan 34 can be installed at the air inlet 32a for producing heat exchanging air flow through the air flow channels 32. The air flow channels 32 extend along the recessed area 30 such that with the thermoelectric device 14 installed within the recessed area 30, air flowing through the air flow channels 32 can contact the thermoelectric device 14 and exchange heat therewith if necessary. As shown in FIG. 5, with the cover portion 28 removed, the cushion material 26 of the lower cushion portion 20 is shaped and configured such that the air inlet 32a connects to and is open for air flow movement through each of the air flow channels 32. Similarly, each of the air flow channels 32 is connected to and is open to the air outlet 32b. The air flow channels 32 are exposed to and open to the recessed area 30. Consequently, when the thermoelectric device 14 is installed within the recessed area 30, air flowing through the air flow channels 32 via the air inlet 32a and the air outlet 32b allows for heat exchange between the air flowing through the air flow channels 32 and the thermoelectric device 14 in a manner described in greater detail below.

As is described in greater detail below, the thermoelectric device 14 and the fan 34 are electrically connected to the control panel 24. The control panel 24 is configured to operate the thermoelectric device 14 and the fan 34. Specifically, when a seat occupant (vehicle passenger) manipulates the control panel 24, the control panel 24 can be set to simultaneously operate both the thermoelectric device 14 and the fan 34. The fan 34 is configured to move air through the air flow channels 32. The control panel 24 is configured to set operation of the thermoelectric device 14 used to operate in a cooling mode or a heating mode, thereby providing either cooling to an exposed passenger contacting surface (and seat occupant) or heating.

A description of the thermoelectric device 14 is now provided with specific reference to FIGS. 6-19. The thermoelectric device 14 includes a foam substrate 40, a plurality of thermoelectric elements 42 and a plurality of foil strip assemblies 44.

As shown in FIGS. 2-5, the thermoelectric device 14 is a device that is configured to provide heating or cooling to the seat assembly 12. As is explained in greater detail below, the plurality of thermoelectric elements 42 are configured to provide the Peltier effect such that the thermoelectric device 14 serves as a heat pump in which heat is drawn from the air flow channels 32 to the passenger contacting surface (move heat from a lower surface 14b to an upper surface 14a of the thermoelectric device 14), or heat is drawn from the passenger contacting surface to the air flow channels 32 (move heat from the upper surface 14a to the lower surface 14b).

Figure 6:
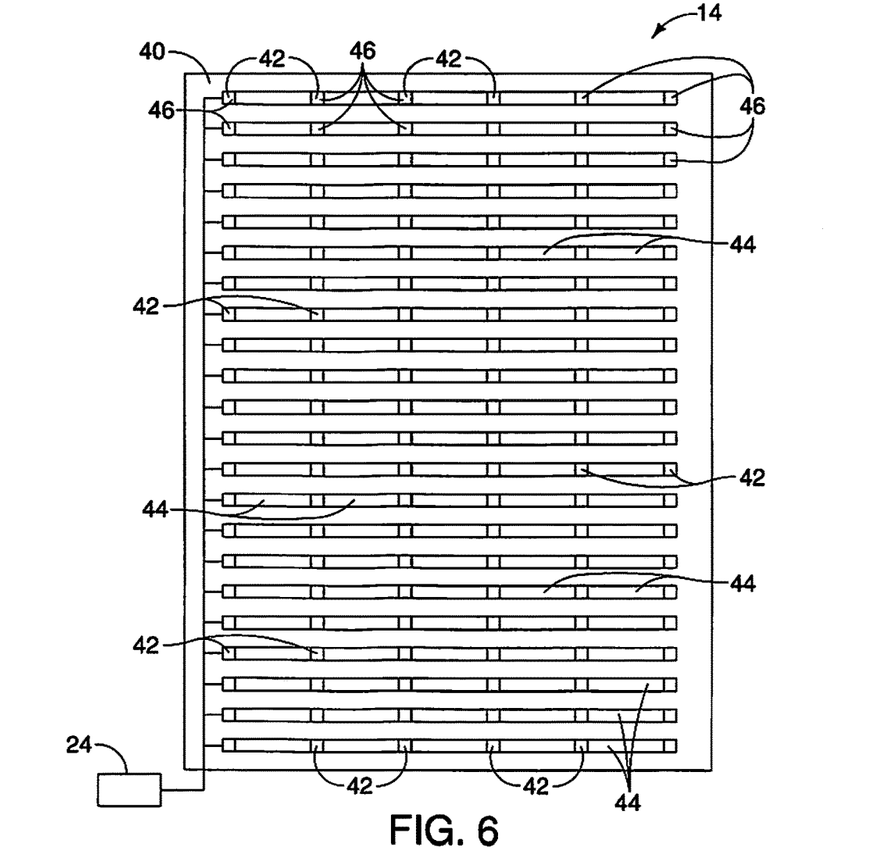
FIG. 6 is a top schematic view of the thermoelectric device (or pad) removed from the vehicle showing details of a foam substrate, a plurality of thermoelectric elements and a plurality of foil strip assemblies in accordance with the one embodiment.
Figure 7:
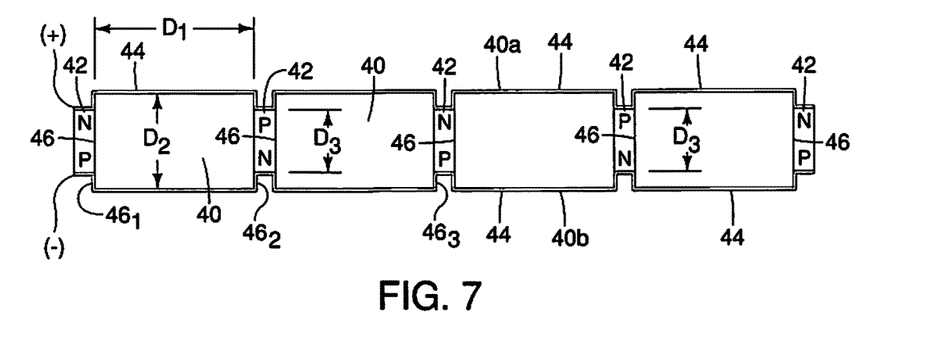
FIG. 7 is a side schematic cross-sectional view of the thermoelectric device (or pad) removed from the vehicle showing details of the foam substrate, part of one row of the thermoelectric elements and part of one row of the foil strip assemblies in accordance with the one embodiment.
Figure 8:
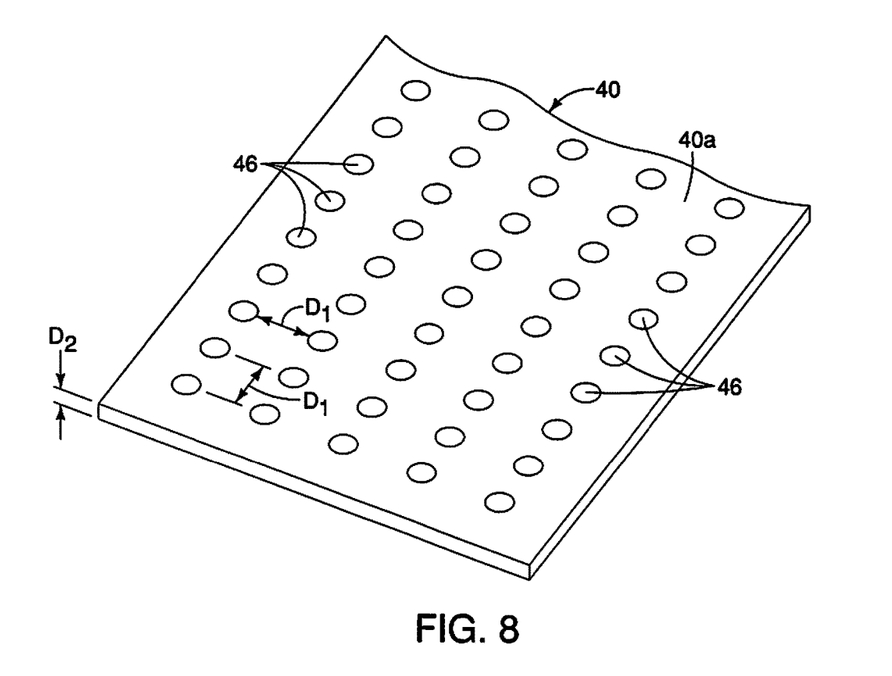
FIG. 8 is a top view of a portion of the foam substrate of the thermoelectric device showing a plurality of apertures formed therein with the plurality of thermoelectric elements and the plurality of foil strip assemblies removed in accordance with the one embodiment.

As shown in FIGS. 6-8, the foam substrate 40 has an upper surface 40a and a lower surface 40b with a plurality of apertures 46 that extend from the upper surface 40a to the lower surface 40b. The plurality of apertures 46 are arranged such that several linear rows of apertures 46 are defined along the foam substrate 40 as shown in FIG. 8. Within each row, the apertures 46 are spaced apart from adjacent ones of the apertures 46 by a predetermined distance $D_1$. As indicated in FIG. 7, the foam substrate 40 is has a thickness $D_2$ that is less than half of the distance $D_1$. In the depicted embodiment the thickness $D_2$ between 8 and 15 mm, but is preferably approximately 10 mm. Further, in the depicted embodiment, the distance $D_1$ is between 15 and 40 mm, but is more preferably between 20 and 30 mm. In the drawings, the distance $D_1$ is approximately 25 mm.

The foam substrate 40 is preferably a heat insulating material. For example, the foam substrate can be made of polyurethane foam, or other suitable material, such as Styrofoam™ (polystyrene foam), natural cloth, synthetic cloth, natural sponge, synthetic sponge, building insulation material, wood, paper, cotton, batting, pipe-wrapping insulation, ceiling tile material, memory foam, cushion material, or any other insulating material. The foam substrate 40 is formulated to be flexible since a passenger will be sitting on one of the thermoelectric devices 14 and/or will be leaning back against one of the thermoelectric devices 14. The plurality of apertures 46 can be formed in the foam substrate 40 by any of a variety of methods. For example, the apertures 46 can be formed at the time the foam substrate is formed (a molding process), or the apertures 46 can be drilled, pressed, stamped, or laser cut out of the foam substrate 40.

Figure 9:
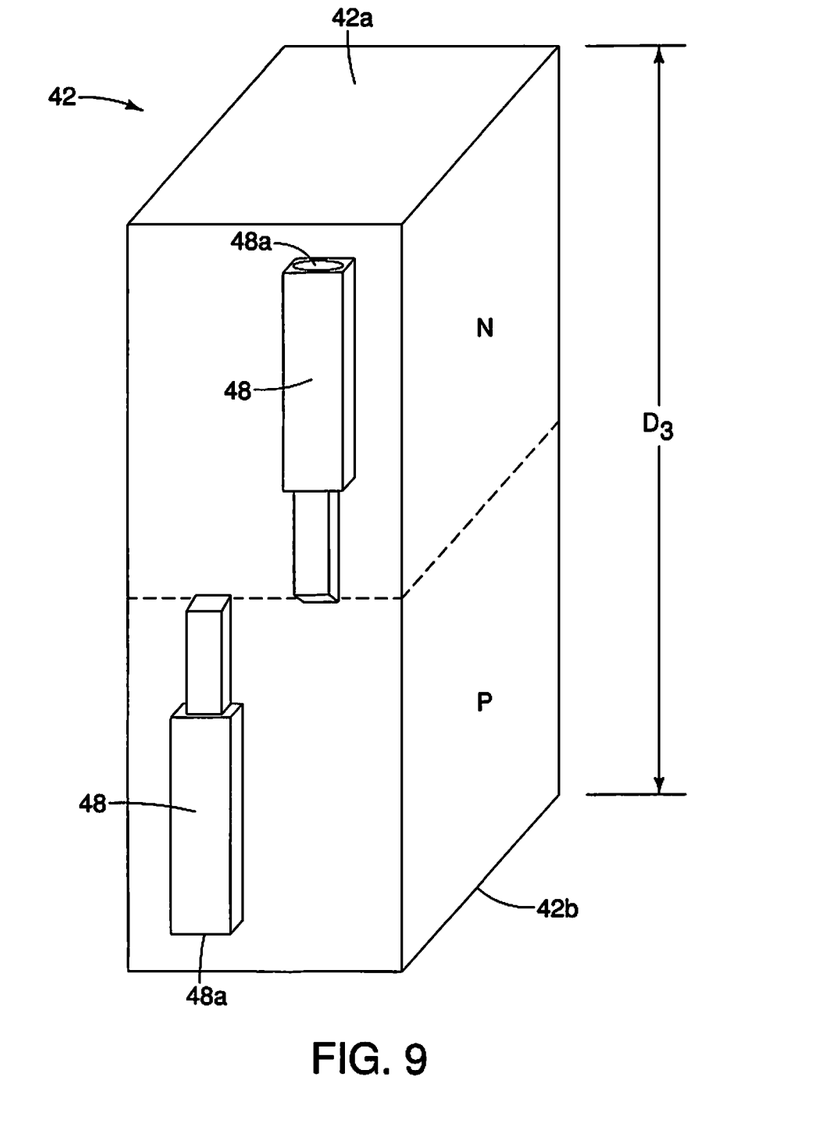
FIG. 9 is a perspective view of one of the thermoelectric elements showing one side thereof with electric connectors in accordance with the one embodiment.

A description of the plurality of thermoelectric elements 42 is now provided with specific reference to FIGS. 7 and 9-12. Each of the plurality of thermoelectric elements 42 is a semiconductor assembly configured to provide the Peltier effect when provided with direct current voltage (DC), drawing heat from one end to an opposite end thereof. In FIG. 9, movement of heat is vertically upward when in the heating mode and vertically downward when in the cooling mode. Each the plurality of thermoelectric elements includes a pair of mated P-type and N-type semiconductor materials with a P-portion and an N-portion joined as opposite halves thereof as shown in FIG. 9. Each of the thermoelectric elements 42 has a height D3 and is provided with four electric connectors 48, with two on each side thereof, as shown in FIG. 9 (only one side is visible in the perspective view). Each connector 48 is configured to receive an electric wire via an opening 48*a* in order to make an electric connection, as is described in greater detail below.

As shown in FIG. 9, on each side of the thermoelectric element 42 one connector 48 is located on the P-portion and one connector 48 is located on the N-portion. The hidden side of the thermoelectric elements 42 in FIG. 9 is similarly provided with two identically arranged connectors 48. With respect to the depiction in FIG. 9, each of the thermoelectric elements 42 defines a first heat transferring surface 42*a* and a second heat transferring surface 42*b* (upper and lower surfaces with respect to the depiction in FIG. 9). It should be understood from the drawings and the description herein that the orientation of the thermoelectric element 42 (P-portion on top or N-portion on top) does not define the location of the heat transferring surfaces. Rather, the first heat transferring surface 42*a* is always defined as the surface facing upward in the depiction in FIGS. 10-12, and the second heat transferring surface 42*b* is always the surface facing downward in FIG. 10-12.

Figure 10:
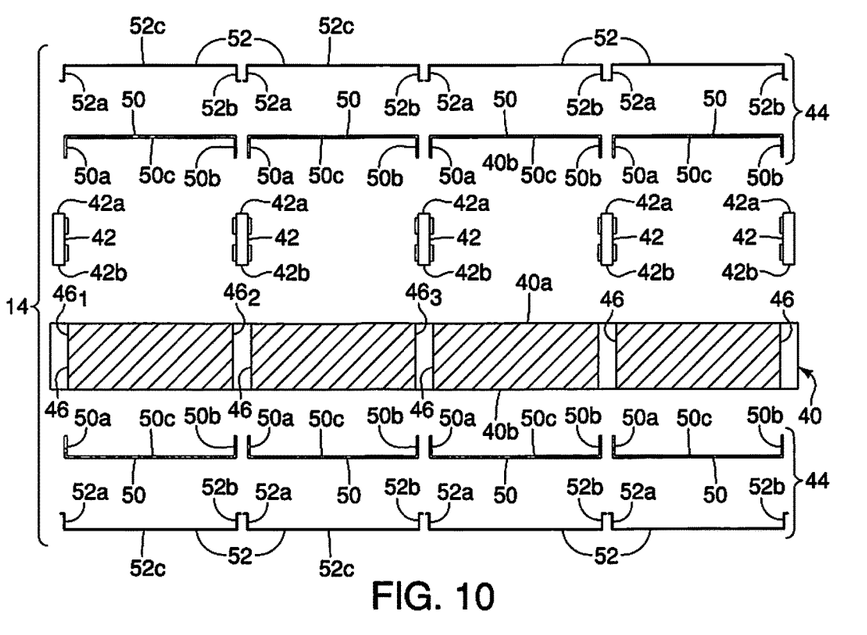
FIG. 10 is an exploded side view of the thermoelectric device showing a portion of the foam substrate, part of one row of the thermoelectric elements and part of one row of the foil strip assemblies prior to assembly in accordance with the one embodiment.

The plurality of thermoelectric elements 42 are inserted into each of the apertures 46, as shown in FIGS. 7 and 10-12. As shown in FIGS. 7 and 10, within each row of apertures 46 the plurality of thermoelectric elements 42 are alternatingly arranged such that every other mated P-type and N-type semiconductor element has the P-portion adjacent to the upper surface 40*a* of the foam substrate 40, with alternating ones having the N-portion being adjacent to the upper surface 40*a* of the foam substrate 40. In other words, as shown in FIG. 7, in a first aperture 46$_1$ of the apertures 46, the P-portion is positioned proximate the upper surface 40*a* and the N-portion is positioned proximate the lower surface 40*b*. In a second aperture 46$_2$ of the apertures 46 adjacent to the first of the apertures 46, the N-portion is proximate the upper surface 40*a* and the P-portion is proximate the lower surface 40*b*. Further, in a third aperture 46$_3$ of the apertures 46, the P-portion is proximate the upper surface 40*a* and the N-portion is proximate the lower surface 40*b*. The alternating arrangement of the P-portion and the N-portion continues throughout the foam substrate 40, alternatingly row by row.

A description is now provided of the plurality of foil strip assemblies 44 with specific reference to FIGS. 10-17. The foil strip assemblies 44 are all identical and therefore description of one of the foil strip assemblies 44 applies equally to all. Each of the foil strip assemblies 44 includes an insulated wire 50 and a metallic foil strip 52 that can be made of, for example, copper or other metal that has good heat transmitting and transferring capabilities.

The insulated wire 50 includes a first connector end 50*a*, a second connector end 50*b* and an insulated portion 50*c* extending between the first connector end 50*a* and the second connector end 50*b*. The metallic foil strip 52 includes a first end 52*a*, a second end 52*b* and an elongated portion 52*c* that extends between the first end 52*a* and the second end 52*b*.

Figure 14:
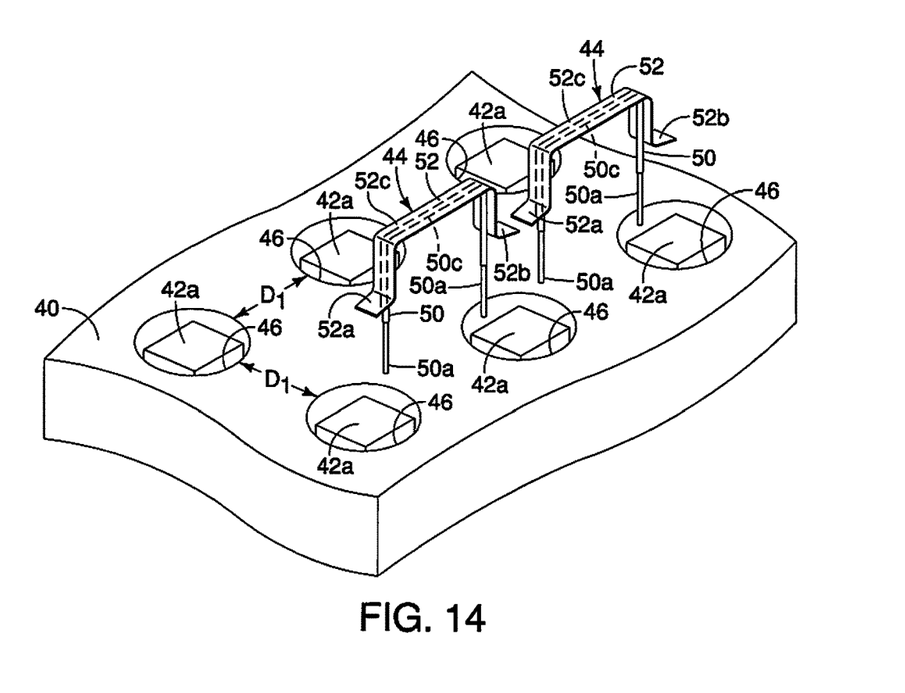
FIG. 14 is an exploded perspective view of the thermoelectric device showing the portion of the foam substrate with the thermoelectric elements installed into respective ones of the apertures and two of the foil strip assemblies prior to installation to the thermoelectric elements in accordance with the one embodiment.
Figure 16:
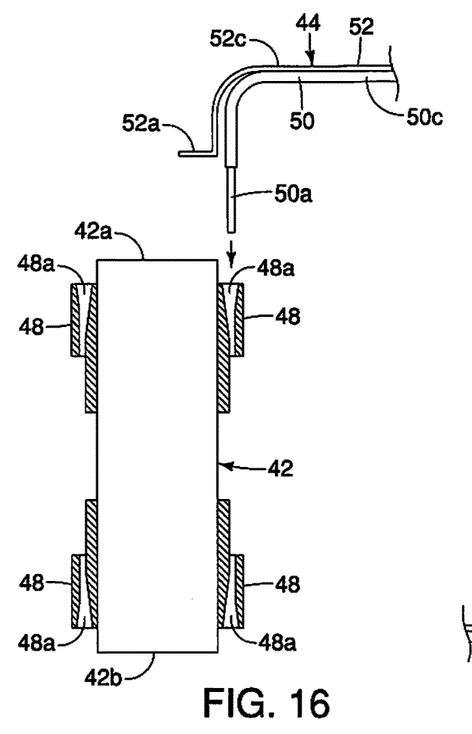
FIG. 16 is an exploded cross-sectional side view of one of the thermoelectric elements showing the first connector end of the insulated wire of one of the foil strip assemblies prior to installation of the first connector end to one of the connectors of the thermoelectric elements in accordance with the one embodiment.

As shown in FIG. 14, the insulated portion 50*c* of the insulated wire 50 is fixedly attached to the elongated portion 52*c* of a corresponding one of the metallic foil strips 52. The insulated portion 50*c* can be adhered to the metallic foil strip 52 by, for example, an adhesive. The insulated wire 50 is not in electrical contact with any portion of the metal foil strip 52. As shown in FIGS. 14-17, insulation is stripped from each of the first connector end 50*a* and the second connector end 50*b*, exposing the wire with in the insulated wire 50 at a location spaced apart from the first end 52*a* and the second end 52*b* of the metallic foil strip 52. The first connector end 50*a* and the second connector end 50*b* extend parallel to one another and extend in a direction perpendicular to the elongated portion 52*c* of the metallic foil strip 52.

A description of the metallic foil strip 52 of the foil strip assembly 44 is now provided with specific reference to FIGS. 14-17. Since the metallic foil strips 52 are all identical, description of one of the metallic foil strips 52 applies equally to all. The metallic foil strip 52 includes the first end 52*a*, the second end 52*b* and the elongated portion 52*c*. Each of the first end 52*a* and the second end 52*b* initially extends away from the elongated portion 52*a* in a direction perpendicular to the elongated portion 52, but includes an end section that is parallel to the elongated portion 52*a* and is specifically dimensioned and oriented to contact one of the upper heat transferring surfaces 42*a* or one of the lower heat transferring surfaces 42*b* of the thermoelectric elements 42.

The elongated portion 52*c* defines a generally planar surface opposite the surface that attaches to the insulated wire 50. The planar surface is provide for the purpose of exchanging heat, either with air flowing through the air flow channels 32 of the seat assembly 12, or exchange heat with the passenger seated in the seat assembly 12, depending upon the installation location of the specific foil strip assembly 44.

As mentioned above, during assembly of the thermoelectric device 14, the thermoelectric elements 42 are inserted into the apertures 46 of the foam substrate 40. The thermoelectric elements 42 can be force fitted into the apertures 46, or alternatively, can be fixed in place by an adhesive. Still further, the thermoelectric elements 42 can be retained within the apertures 46 via partial melting of surrounding portions of the foam substrate 40.

Figure 17:
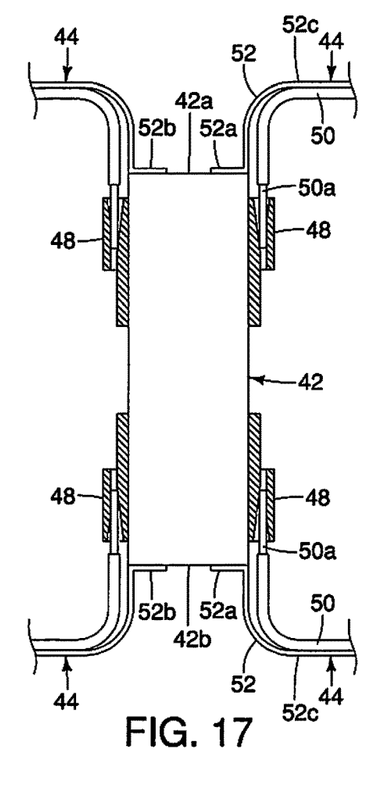
FIG. 17 is a cross-sectional side view similar to FIG. 16 showing the first connector end of the insulated wire of one of the foil strip assemblies installed into the connector of the thermoelectric element in accordance with the one embodiment.

Next, the first connector ends 50*a* and second connector ends 50*b* of the insulated wire 50 of each of the assembled foil strip assembles 44 are aligned respective apertures 46 and then moved into the apertures 46 for installation into corresponding ones of the thermoelectric devices 14, as indicated in FIGS. 11, 12, 14 and 16-17. More specifically the first connector ends 50a and the second connector ends 50b are installed to corresponding ones of the connectors 48 of the thermoelectric elements 42. While the first connector ends 50a and the second connector ends 50b are moved into the apertures 46 and installed to the connectors 48, the first ends 52a and second ends 52b of the metallic foil strips 52 are also inserted into corresponding ones of the apertures 46. Since the insulation portion 50c of the insulated wire 50 and the elongated portion 52c of the metallic foil strip 52 are fixedly attached to one another, when the first connector ends 50a and the second connector ends 50b are moved toward and installed to corresponding ones of the connectors 48, the first ends 52a and the second ends 52b are simultaneously moved and brought into contact with respective ones of the upper heat transferring surfaces 42a and the lower heat transferring surfaces 42b, as shown in FIG. 17. Contact between the first ends 52a and the second ends 52b and respective ones of the upper heat transferring surfaces 42a and the lower heat transferring surfaces 42b provide heat conduction between the metallic foil strips 52 and the thermoelectric elements 42. The first ends 52a and the second ends 52b are fixed to corresponding ones of the upper heat transferring surfaces 42a and the lower heat transferring surfaces 42b by, for example, a thermally-conductive adhesive or mechanical fastener, such as rivet, snap-fitting pin or threaded fastener. Alternatively, a soldering or welding material can be used. It should be understood from the drawings and the description herein, that any of a variety of fastening means can be used to fix the first ends 52a and the second ends 52b to the upper heat transferring surfaces 42a and the lower heat transferring surfaces 42b.

Figure 11:
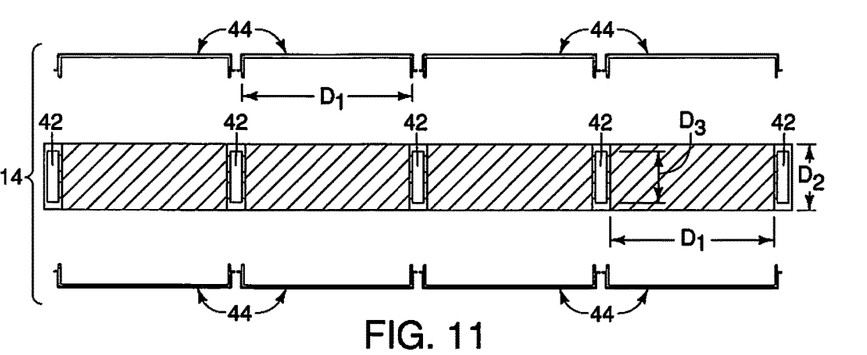
FIG. 11 is another exploded side view of the thermoelectric device showing the portion of the foam substrate with the thermoelectric elements installed into respective ones of the apertures and the part of the one row of the foil strip assemblies prior to assembly in accordance with the one embodiment.
Figure 12:
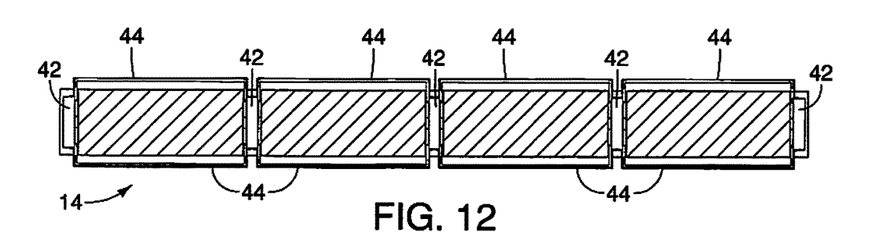
FIG. 12 is a side view of the thermoelectric device in an assembled state showing the portion of the foam substrate with the thermoelectric elements installed into respective ones of the apertures and the foil strip assemblies installed to the thermoelectric elements in accordance with the one embodiment.
Figures 13, 15:
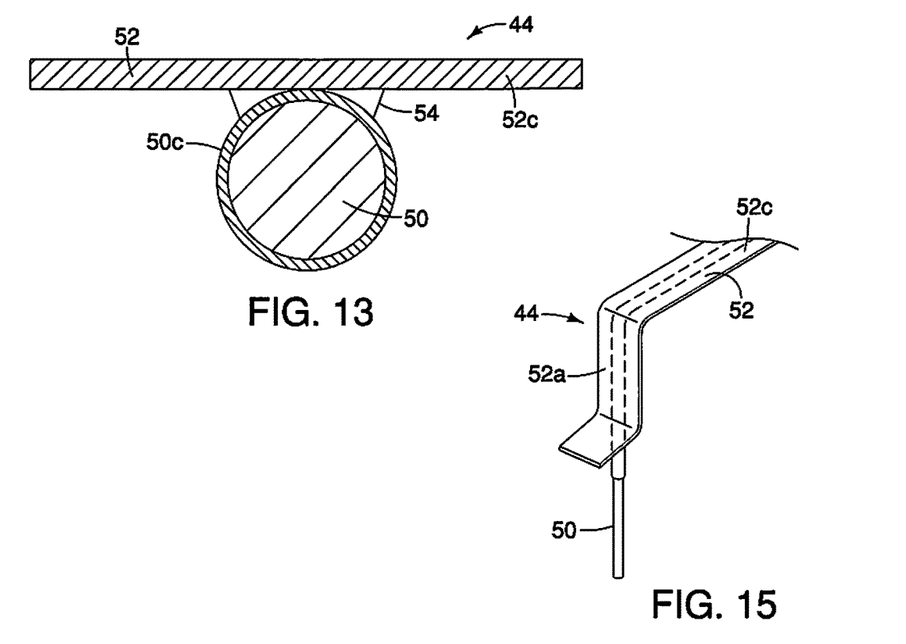
FIG. 13 is a cross-sectional view of one of the foil strip assemblies showing an elongated portion of a metallic foil strip attached to an insulated portion of an insulted wire in accordance with the first embodiment.
FIG. 15 is a perspective view of a portion of one of the foil strip assemblies showing a portion of the elongated portion of the metallic foil strip and a first connector end of an insulted wire, with insulation removed from the first connector end in accordance with the one embodiment.

Referring now to FIG. 10-12, during the assembly of the thermoelectric device 14, a first end 52a of a first one of the foil strip assemblies 44 (first one at the left of FIGS. 10-12) is inserted into the first aperture $46_1$ of the foam substrate 40 making contact the upper heat transferring surface 42a of the thermoelectric element 42 therein. Meanwhile, the second end 52a of the first one of the foil strip assemblies 44 (first one at the left of FIGS. 10-12) is inserted into the second aperture $46_2$ of the foam substrate 40 making contact with the upper heat transferring surface 42a of the thermoelectric element 42 in the second aperture $46_2$. A first end 52a of a second one of the foil strip assemblies 44 (second one from the left of FIGS. 10-12) is inserted into the second aperture $46_2$ of the foam substrate 40 making contact the upper heat transferring surface 42a of the thermoelectric element 42 in the second aperture $46_2$. Meanwhile, the second end 52a of the second one of the foil strip assemblies 44 (second one at the left of FIGS. 10-12) is inserted into the third aperture $46_3$ of the foam substrate 40 making contact with the upper heat transferring surface 42a of the thermoelectric element 42 in the third aperture $46_3$. Further, the first end 52a of a third one of the foil strip assemblies 44 (third one from the left of FIGS. 10-12) is also inserted into the third aperture $46_3$ of the foam substrate 40 making contact the upper heat transferring surface 42a of the thermoelectric element 42 in the third aperture $46_3$.

As shown in the FIGS. 10-12, (not including end ones of the foil strip assemblies 44) the second end 52b of the metallic foil strip 52 of a preceding one of the foil strip assemblies 44 is inserted into a corresponding aperture 46 along with the first end 52a of the metallic foil strip 52 of a subsequent one of the foil strip assemblies 44. Similarly, the second connector end 50a of the insulated wire 50 of a preceding one of the foil strip assemblies 44 is inserted into a corresponding aperture 46 with the first connector end 50a of the insulated wire 50 of a subsequent one of the foil strip assemblies 44. Further, as shown in FIGS. 10-12, a first group of the foil strip assemblies 44 are attached to upper ends of the thermoelectric elements 42 in the manner described above, and a second group of the foil strip assemblies 44 are attached to lower ends of the thermoelectric elements 42. Hence, the metallic foil strips 52 of the first group of the foil strip assemblies 44 extend along corresponding portions of the upper surface 40a of the foam substrate 40 and the metallic foil strips 52 of the second group of the foil strip assemblies 44 extend along corresponding portions of the lower surface 40b of the foam substrate 40

Thus, with the exception of end ones of the thermoelectric elements 42, each thermoelectric element 42 has two different foil strip assemblies 44 attached to an upper end thereof, and a lower end thereof.

Put another way, the first group of the plurality of foil strip assemblies 44 are arranged end to end linearly along corresponding portions of the upper surface 40a of the foam substrate 40 with respective ones of first connector ends 50a and the second connector ends 50b of the insulated wires 50 electrically connecting linearly adjacent pairs of plurality of thermoelectric elements 42 in series. The second group of the plurality of foil strip assemblies 44 are arranged end to end linearly along corresponding portions of the lower surface 40b of the foam substrate 40 aligned with the first group of the plurality of foil strip assemblies 44, with respective ones of the insulated wires 50 electrically connecting the linearly adjacent pairs of plurality of thermoelectric elements 42 in series.

Figure 18:
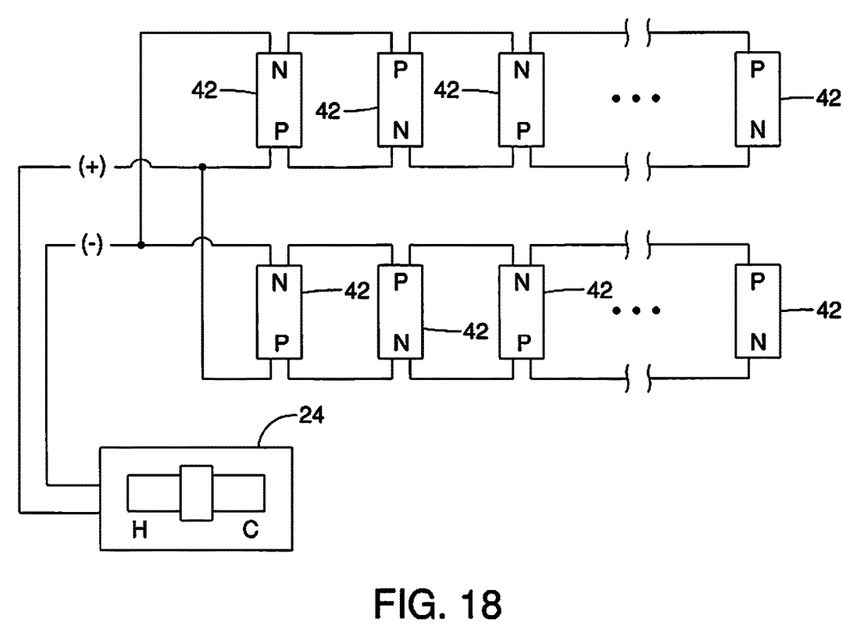
FIG. 18 is a schematic view of the thermoelectric device electrically connected to a control panel configured to set the thermoelectric device to operate in a cooling mode or set the thermoelectric device to operate in a heating mode in accordance with the one embodiment.

As shown in schematically in FIG. 18, the thermoelectric elements 42 are electrically connected to the control panel 24. The control panel 24 can include a switch movable from an off position (center) to either a heating mode position (left in alignment with the letter H) or a cooling mode position (right in alignment with the letter C). In the heating mode position, direct current is allowed to flow through the thermoelectric elements 42 in a direction that causes heat to be moved upward from the air flow channels 32 to the cushion material 26 and to the passenger seated in the seat assembly 12 (see FIGS. 2 and 3). Simultaneously, the fan 34 is turned on so that air is forced to flow through the air flow channels 32 providing a source of heat to the lower surface 14b of the thermoelectric device 14 (see FIG. 5). Heat is moved via the Peltier effect upward providing warmth to the passenger seated in the seat assembly 12.

In the cooling mode position, direct current is allowed to flow through the thermoelectric elements 42 in a direction opposite that of the heating mode position causing heat to be moved downward from the cushion material 26 and the passenger seated in the seat assembly 12 to the air flow channels 32. Simultaneously, the fan 34 is turned on so that air is forced to flow through the air flow channels 32 drawing heat away from the lower surface 14b of the thermoelectric device 14. The movement of heat downward is provided by the Peltier effect cooling the cover portion 28 of the seat assembly 12 and cooling the passenger seated in the seat assembly 12.

The various elements of the vehicle 10 not described herein are conventional components that are well known in the art. Since such vehicle element are well known in the art, these structures will not be discussed or illustrated in detail herein. Rather, it will be apparent to those skilled in the art from this disclosure that the components can be any type of structure and/or programming that can be used to carry out the present invention.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment, the following directional terms "forward", "rearward", "above", "downward", "vertical", "horizontal", "below" and "transverse" as well as any other similar directional terms refer to those directions of a vehicle equipped with the thermoelectric device. Accordingly, these terms, as utilized to describe the present invention should be interpreted relative to a vehicle equipped with the thermoelectric device.

The term "detect" as used herein to describe an operation or function carried out by a component, a section, a device or the like includes a component, a section, a device or the like that does not require physical detection, but rather includes determining, measuring, modeling, predicting or computing or the like to carry out the operation or function.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such features. Thus, the foregoing descriptions of the embodiments according to the present invention are provided for illustration only, and not for the purpose of limiting the invention as defined by the appended claims and their equivalents.

What is claimed is:

1. A thermoelectric device, comprising:
   a foam substrate having an upper surface and a lower surface, the foam substrate including a plurality of apertures that extend from the upper surface to the lower surface, the plurality of apertures defining at least one linear row of apertures having at least a first aperture, a second aperture and a third aperture spaced apart from one another by a predetermined distance;
   a plurality of thermoelectric elements including at least a first element, a second element and a third element, each being inserted into a corresponding one of the first, second and third apertures; and
   a plurality of metallic foil strips including at least a first upper foil strip and a second upper foil strip, each of the plurality of metallic foil strips having a first end, a second end and an elongated portion extending therebetween, the first end of the first upper foil strip being inserted into the first aperture contacting an upper heat transferring surface of the first element and the second end being inserted into the second aperture contacting an upper heat transferring surface of the second element with the elongated portion of the first upper foil strip extending between the first aperture and the second aperture along a corresponding portion of the upper surface of the foam substrate, and
   the first end of the second upper foil strip being inserted into the second aperture contacting the upper heat transferring surface of the second element and the second end being inserted into the third aperture contacting an upper heat transferring surface of the third element with the elongated portion of the second upper foil strip extending between the second aperture and the third aperture along a second corresponding portion of the upper surface of the foam substrate.

2. The thermoelectric device according to claim 1, wherein
   the at least one linear row of apertures includes a fourth aperture,
   the plurality of thermoelectric elements includes a fourth element inserted into the fourth aperture, and
   the plurality of metallic foil strips includes a third upper foil strip, the first end of the third upper foil strip being inserted into the third aperture contacting the upper heat transferring surface of the third element and the second end being inserted into the fourth aperture contacting an upper heat transferring surface of the fourth element with the elongated portion of the third upper foil strip extending between the third aperture and the fourth aperture along a third corresponding portion of the upper surface of the foam substrate.

3. The thermoelectric device according to claim 1, wherein
   each of the plurality of thermoelectric elements includes a first connector located on a first side surface adjacent to the upper heat transferring surface and a second connector located on a second side surface adjacent to the upper heat transferring surface with the upper heat transferring surface being located between the first side surface and the second side surface,
   the first upper foil strip includes a first wire having a first connector end, a second connector end and an insulated portion that extends from adjacent the first connector end to adjacent the second connector end, the insulated portion being attached to the elongated portion of the first upper foil strip,
   the second upper foil strip includes a second wire having a first connector end, a second connector end and an insulated portion that extends from adjacent the first connector end to adjacent the second connector end, the insulated portion being attached to the elongated portion of the second upper foil strip, and
   the first connector end of the first wire is electrically connected to the second connector of the first element, the second connector end of the first wire is electrically connected to the first connector of the second element, the first connector end of the second wire is electrically connected to the second connector of the second element and the second connector end of the second wire is electrically connected to the first connector of the third element.

4. The thermoelectric device according to claim 3, wherein the plurality of metallic foil strips including at least a first lower foil strip and a second lower foil strip, a first end of the first lower foil strip being inserted into the first aperture contacting a lower heat transferring surface of the first element and the second end of the first lower foil strip being inserted into the second aperture contacting a lower heat transferring surface of the second element with the elongated portion of the first lower foil strip extending between the first aperture and the second aperture along a corresponding portion of the lower surface of the foam substrate, and the first end of the second lower foil strip is inserted into the second aperture contacting the lower heat transferring surface of the second element and the second end of the second lower foil strip is inserted into the third aperture contacting a lower heat transferring surface of the third element with the elongated portion of the second lower foil strip extending between the second aperture and the third aperture along a second corresponding portion of the lower surface of the foam substrate.

5. The thermoelectric device according to claim 4, wherein each of the plurality of thermoelectric elements includes a third connector located on the first side surface adjacent to the lower heat transferring surface and a fourth connector located on the second side surface adjacent to the lower heat transferring surface with the lower heat transferring surface being located between the first side surface and the second side surface, the first lower foil strip includes a first lower wire having a first connector end, a second connector end and an insulated portion that extends from adjacent the first connector end to adjacent the second connector end, the insulated portion being attached to the elongated portion of the first lower foil strip, the second lower foil strip includes a second lower wire having a first connector end, a second connector end and an insulated portion that extends from adjacent the first connector end to adjacent the second connector end, the insulated portion being attached to the elongated portion of the second lower foil strip, and the first connector end of the first lower wire is electrically connected to the fourth connector of the first element, the second connector end of the first lower wire is electrically connected to the third connector of the second element, the first connector end of the second lower wire is electrically connected to the fourth connector of the second element and the second connector end of the second lower wire is electrically connected to the third connector of the third element.

6. A thermoelectric device, comprising:

a foam substrate having an upper surface and a lower surface, and defining a plurality of apertures that extend from the upper surface to the lower surface, the apertures being spaced apart from adjacent apertures by a predetermined distance;

a plurality of thermoelectric elements, the plurality of thermoelectric elements being inserted in corresponding ones of the plurality of apertures; and a plurality of metallic foil strip assemblies, each of the plurality of metallic foil strip assemblies including a foil strip and a corresponding wire having a first connector end, a second connector end and an insulated portion, the foil strip having a first end and a second end with the elongated portion being located therebetween, with the elongated portion being attached to insulation of the insulated portion of the wire, each of the elongated portions having a length that is at least the predetermined distance, a first group of the plurality of metallic foil strip assemblies being arranged end to end linearly along corresponding portions of the upper surface of the foam substrate with respective ones of first connector ends and the second connector ends of the wires electrically connecting a linearly adjacent pairs of plurality of thermoelectric elements in series, with a second group of the plurality of metallic foil strip assemblies being arranged end to end linearly along corresponding portions of the lower surface of the foam substrate aligned with the first group, with respective ones of the wires electrically connecting the linearly adjacent pairs of plurality of thermoelectric elements in series, and with the first ends of each of the foil strips and the second ends of each of the foil strips contacting respective ends of the plurality of thermoelectric elements for heat conduction therebetween.

7. The thermoelectric device according to claim 6, wherein the first end of each of the foil strips extend into a corresponding one of the apertures and contact a heat transferring surface of a corresponding one of the plurality of thermoelectric elements, and the second end of each of the foil strips extending into an adjacent one of the apertures and contacting a heat transferring surface of an adjacent one of the plurality of thermoelectric elements.

8. The thermoelectric device according to claim 6, wherein the elongated portion of each of the foil strips has a generally planar shape for transference of heat.

9. The thermoelectric device according to claim 6, wherein each of the plurality of thermoelectric elements comprises a pair of mated p-type and n-type semiconductor elements with a P-portion and an N-portion.

10. The thermoelectric device according to claim 9, wherein the plurality of thermoelectric elements are alternatingly arranged such that every other mated p-type and n-type semiconductor element has the P-portion adjacent to the upper surface of the foam substrate, with alternating ones having the N-portion being adjacent to the upper surface of the foam substrate.

11. A vehicle seat structure comprising:

a cushion portion having air flow channels formed therein adjacent to a heating element recess, with the thermoelectric device according to claim 6 being installed within the heating element recess.

12. A vehicle seat structure according to claim 11, wherein the cushion portion includes a fan configured to move air through the air flow channels.

13. A method of making a thermoelectric device, comprising:

forming a foam substrate having an upper surface and a lower surface with a plurality of apertures that extend from the upper surface to the lower surface, the plurality of apertures defining a plurality of linear rows of apertures;

inserting a plurality of thermoelectric elements into corresponding ones of the plurality of apertures;

attaching a plurality of metallic foil strips to corresponding wires;

attaching the wires to the plurality of thermoelectric elements defining a plurality of discrete rows of electrically connected thermoelectric elements, each row of thermoelectric elements being connected to one another in series with a first group of the wires extending along the upper surface of the foam substrate; and bringing the plurality of metallic foil strips into contact with corresponding ones of the thermoelectric elements such that heat can freely move between the metallic foil strips and the thermoelectric elements.

14. The method of making a thermoelectric device according to claim 13, wherein
the attaching of the wires to the plurality of thermoelectric elements defining the plurality of discrete rows of electrically connected thermoelectric elements also includes each row of thermoelectric elements being connected to one another in series with a second group of the wires extending along the lower surface of the foam substrate.

15. The method of making a thermoelectric device according to claim 13, wherein
the attaching of the plurality of metallic foil strips to the corresponding wires includes providing each metallic foil strip with a first end, a second end and an elongated portion extending between the first end and the second end and attaching insulation of the wire to the elongated portion.

16. The method of making a thermoelectric device according to claim 15, wherein
the bringing of the plurality of metallic foil strips into contact with corresponding ones of the thermoelectric elements includes putting the first end in contact with a heat transferring surface of a corresponding one of the thermoelectric elements and putting the second end in contact with a heat transferring surface of an adjacent one of the thermoelectric elements.

17. The method of making a thermoelectric device according to claim 15, wherein
the attaching of the plurality of metallic foil strips to the corresponding wires further includes providing each wire with a first connector end, a second connector end and an insulated portion that includes the insulation subsequently attached to the metallic foil strips.

18. The method of making a thermoelectric device according to claim 17, wherein
the attaching of the wires to the plurality of thermoelectric elements includes electrically connecting the first connector end of a first wire to a connector of a first thermoelectric elements and connecting the second connector end to a connector of a second thermoelectric elements, and
connecting the first connector end of a second wire to a second connector of the second thermoelectric elements and connecting the second connector end of the second wire to a connector of a third thermoelectric elements.

19. The method of making a thermoelectric device according to claim 13, wherein
the inserting of the plurality of thermoelectric elements into corresponding ones of the plurality of apertures includes:
each of the plurality of thermoelectric elements comprising a pair of mated p-type and n-type semiconductor elements with a P-portion and an N-portion; and
inserting the thermoelectric elements such that they are alternatingly arranged with every other P-portion is adjacent to the upper surface of the foam substrate, with alternating ones having the N-portion being adjacent to the upper surface of the foam substrate.

* * * * *